United States Patent
Chou et al.

(10) Patent No.: US 7,881,021 B2
(45) Date of Patent: Feb. 1, 2011

(54) CPP TYPE MAGNETORESISTIVE DEVICE WITH BIASING ARRANGEMENT FOR FERROMAGNETIC LAYERS HAVING RESPECTIVE MAGNETIZATIONS ORTHOGONAL TO ONE ANOTHER, AND MAGNETIC DISK SYSTEM USING SAME

(75) Inventors: Tsutomu Chou, Tokyo (JP); Yoshihiro Tsuchiya, Tokyo (JP); Daisuke Miyauchi, Tokyo (JP); Takahiko Machita, Tokyo (JP); Shinji Hara, Tokyo (JP); Tomohito Mizuno, Tokyo (JP); Hironobu Matsuzawa, Tokyo (JP); Toshiyuki Ayukawa, Tokyo (JP); Koji Shimazawa, Tokyo (JP); Kiyoshi Noguchi, Tokyo (JP)

(73) Assignee: TDK Corporation, Tokyo (JP)

( * ) Notice: Subject to any disclaimer, the term of this patent is extended or adjusted under 35 U.S.C. 154(b) by 558 days.

(21) Appl. No.: 12/022,538

(22) Filed: Jan. 30, 2008

(65) Prior Publication Data

US 2009/0190270 A1 Jul. 30, 2009

(51) Int. Cl.
*G11B 5/39* (2006.01)
(52) U.S. Cl. .................... 360/324; 360/324.12
(58) Field of Classification Search ........ 360/324–324.2; 365/145, 158, 171–173; 257/421–427; 428/810–816
See application file for complete search history.

(56) References Cited

U.S. PATENT DOCUMENTS 7,177,122 B2 * 2/2007 Hou et al. ............... 360/324.12

FOREIGN PATENT DOCUMENTS

| JP | 6-267034 | 9/1994 |
| JP | 9-251612 | 9/1997 |
| JP | 2002-171013 | 6/2002 |
| JP | 2002-252394 | 9/2002 |

OTHER PUBLICATIONS

U.S. Appl. No. 11/968,911, filed Jan. 3, 2008, Tsuchiya, et al.
U.S. Appl. No. 12/019,202, filed Jan. 24, 2008, Machita, et al.
U.S. Appl. No. 12/019,205, filed Jan. 24, 2008, Machita, et al.

(Continued)

*Primary Examiner*—A. J. Heinz
(74) *Attorney, Agent, or Firm*—Oblon, Spivak, McClelland, Maier & Neustadt, L.L.P.

(57) ABSTRACT

A magnetoresistive device with CPP structure, comprising a nonmagnetic intermediate layer, and a first ferromagnetic layer and a second ferromagnetic layer stacked and formed with said nonmagnetic intermediate layer interposed between them, wherein each of said first and second ferromagnetic layers comprises a sensor area joining to the nonmagnetic intermediate layer and a magnetization direction control area that extends further rearward from the position of the rear end of said nonmagnetic intermediate layer; a magnetization direction control multilayer arrangement is interposed at an area where the magnetization direction control area for said first ferromagnetic layer is opposite to the magnetization direction control area for said second ferromagnetic layer to produce magnetizations of the said first and second ferromagnetic layers which are antiparallel with each other; and said sensor area is provided at both width direction ends with biasing layers working such that the mutually antiparallel magnetizations of said first and second ferromagnetic layers intersect in substantially orthogonal directions.

12 Claims, 8 Drawing Sheets

OTHER PUBLICATIONS

U.S. Appl. No. 12/014,575, filed Jan. 15, 2008, Chou, et al.
U.S. Appl. No. 11/856,438, filed Sep. 17, 2007, Shimazawa, et al.
U.S. Appl. No. 12/126,567, filed May 23, 2008, Ayukawa, et al.
U.S. Appl. No. 12/128,352, filed May 28, 2008, Mizuno, et al.
U.S. Appl. No. 12/112,598, filed Apr. 30, 2008, Hara, et al.
U.S. Appl. No. 12/255,105, filed Oct. 21, 2008, Chou, et al.

* cited by examiner

CPP TYPE MAGNETORESISTIVE DEVICE WITH BIASING ARRANGEMENT FOR FERROMAGNETIC LAYERS HAVING RESPECTIVE MAGNETIZATIONS ORTHOGONAL TO ONE ANOTHER, AND MAGNETIC DISK SYSTEM USING SAME

BACKGROUND OF THE INVENTION

1. Field of the Invention

The present invention relates to a magnetoresistive device adapted to read the magnetic field intensity of magnetic recording media or the like as signals, and a thin-film magnetic head comprising that magnetoresistive device as well as a head gimbal assembly and a magnetic disk system, one each including that thin-film magnetic head.

2. Explanation of the Prior Art

In recent years, with an increase in the recording density of hard disks (HDDs), there have been growing demands for improvements in the performance of thin-film magnetic heads. For the thin-film magnetic head, a composite type thin-film magnetic head has been widely used, which has a structure wherein a reproducing head having a read-only magnetoresistive device (hereinafter often called the MR device for short) and a recording head having a write-only induction type magnetic device are stacked together.

With an increase in the recording density, there has been a growing demand for the reproducing device of the reproducing head to have narrower shield gaps and narrower tracks, and there is now a GMR device with the CPP (current perpendicular to plane) structure (CPP-GMR device) proposed in the art, in which upper and lower shield layers and a magnetoresistive device are connected electrically in series to make do without any insulating layer between the shields. This technology is thought of as inevitable to achieve such recording densities as exceeding 200 Gbits/in$^2$.

Such a CPP-GMR device has a multilayer structure comprising a first ferromagnetic layer and a second ferromagnetic layer between which an electroconductive, nonmagnetic intermediate layer is sandwiched from both its sides. A typical multilayer structure for the spin valve type CPP-GMR device comprises, in order from a substrate side, a lower electrode/antiferromagnetic layer/first ferromagnetic layer/electroconductive, nonmagnetic intermediate layer/second ferromagnetic layer/upper electrode stacked together in order.

The direction of magnetization of the first ferro-magnetic layer that is one of the ferromagnetic layers remains fixed such that when an externally applied magnetic field is zero, it is perpendicular to the direction of magnetization of the second ferromagnetic layer. The fixation of the direction of magnetization of the first ferromagnetic layer is achieved by the exchange coupling of it with an antiferromagnetic layer provided adjacent to it, whereby unidirectional anisotropic energy (also called the "exchange bias" or "coupled magnetic field") is applied to the first ferromagnetic layer. For this reason, the first ferromagnetic layer is also called the fixed magnetization layer. By contrast, the second ferromagnetic layer is also called the free layer. Further, if the fixed magnetization layer (the first ferromagnetic layer) is configured as a triple-layer structure of a ferromagnetic layer/nonmagnetic metal layer/ferromagnetic layer (the so-called "multilayer ferri-structure" or "synthetic pinned layer"), it is then possible to give a strong exchange coupling between both ferromagnetic layers thereby effectively increasing the exchange coupling force from the antiferromagnetic layer, and to reduce influences on the free layer of a static magnetic field resulting from the fixed magnetization layer. Thus, the "synthetic pinned structure" is now in extensive use.

To meet the demands toward recent ultra-high recording densities, however, it is an essential requirement to diminish the "width" and "height" of the magnetoresistive device built in the reproducing (read) head.

To lower the height of the magnetoresistive device, viz., to make the device much thinner, U.S. Pat. Nos. 5,576,914, 6,724,583, 7,117,122, etc. have come up with a novel GMR device structure basically comprising a simple triple-layer structure of a ferromagnetic layer/nonmagnetic intermediate layer/ferromagnetic layer. According to those publications, under the action of a bias magnetic field, there is an initial state created in which the magnetizations of two magnetic layers (free layers) are inclined about 45° with respect to the track width direction. Upon detection of a signal magnetic field from a medium in the initial state of the device, the directions of magnetization of the two magnetic layers change as if scissors cut paper, with the result that there is a change in the resistance value of the device. In the present disclosure, the GMR device of such structure may be called the "scissors type GMR device" for the sake of convenience.

With the head structure using the aforesaid conventional "scissors type GMR device", a bias magnetic field is applied to the GMR device, whereby the relative angle of magnetization of two magnetic layers (free layers) is adjusted to about 90° to create the so-called initial state. However, nowhere are the two magnetic layers (free layers) fixed, offering a problem that their magnetization directions get erratic. Further in the prior art, there is a permanent magnet provided so as to adjust the magnetization directions of two magnetic layers (free layers); however, much of the magnetic flux generated out of it leaks out toward two shield layers positioned above and below, rendering the magnetization direction adjustment function that it should have likely to decline, and making it necessary for the permanent magnet to be much larger than other parts, so ending up with much difficulty in size reductions of the whole device.

The situations being like this, the invention has been made for the purpose of a novel magnetoresistive device that, while the magnetization directions of two magnetic layers (free layers) stay stabilized, can have high reliability, and can improve linear recording densities by the adoption of a structure capable of narrowing the read gap (the gap between the upper and lower shields) thereby meeting recent demands for ultra-high recording densities, and a thin-film magnetic head comprising that magnetoresistive device as well as a head gimbal assembly and a magnetic disk system, one each comprising that thin-film magnetic head.

SUMMARY OF THE INVENTION

According to the present invention, the aforesaid object is accomplished by the provision of a magnetoresistive device with the CPP (current perpendicular to plane) structure, comprising a nonmagnetic intermediate layer, and a first ferromagnetic layer and a second ferromagnetic layer stacked and formed with said nonmagnetic intermediate layer interposed between them, with a sense current applied in the stacking direction, wherein each of said first and second ferromagnetic layers comprises a sensor area joining to the nonmagnetic intermediate layer near a medium opposite plane and a magnetization direction control area that extends further rearward (toward the depth side) from the position of the rear end of said nonmagnetic intermediate layer; a magnetization direction control multilayer arrangement is interposed at an area where the magnetization direction control area for said first ferromagnetic layer is opposite to the magnetization direction control area for said second ferromagnetic layer in such a way that the magnetizations of the said first and second ferromagnetic layers are antiparallel with each other along the width direction axis; and said sensor area is provided at both width direction ends with biasing layers working such that the mutually antiparallel magnetizations of said first and second ferromagnetic layers intersect in substantially orthogonal directions.

In a preferable embodiment of the magnetoresistive device of the invention, said magnetization direction control multilayer arrangement comprises, in order from said first ferromagnetic layer side, a first exchange coupling transfer layer, a first fixed magnetization layer, an antiferromagnetic layer, a second fixed magnetization layer, and a second exchange coupling transfer layer.

According to a preferable embodiment of the magnetoresistive device of the invention, in said magnetization direction control multilayer arrangement, said first and second fixed magnetization layers have magnetizations fixed by said antiferromagnetic layer in the same direction, and the magnetizations of said first and second ferromagnetic layers are antiparallel with each other along the width direction axis depending on what material is selected for each of said first and second exchange coupling transfer layers and what film thickness said material has.

In a preferable embodiment of the magnetoresistive device of the invention, said first exchange coupling transfer layer is set up such that there is an antiferromagnetic coupling between said first ferromagnetic layer and said first fixed magnetization layer, and said second exchange coupling transfer layer is set up such that there is a ferromagnetic coupling between said second ferromagnetic layer and said second fixed magnetization layer.

In a preferable embodiment of the magnetoresistive device of the invention, said first exchange coupling transfer layer is set up such that there is a ferromagnetic coupling between said first ferromagnetic layer and said first fixed magnetization layer, and said second exchange coupling transfer layer is set up such that there is an antiferromagnetic coupling between said second ferromagnetic layer and said second fixed magnetization layer.

In a preferable embodiment of the magnetoresistive device of the invention, the ends, near said sensor area, of the biasing layers formed at both width direction ends of said sensor area form the same magnetic pole, and the directions of application of bias magnetic fields from both the biasing layers are opposite to each other along the width direction.

In a preferable embodiment of the magnetoresistive device of the invention, each of said first and second ferromagnetic layers has a single domain structure.

In a preferable embodiment of the magnetoresistive device of the invention, each of said first and second ferromagnetic layers has a width of 20 to 100 nm, and a depth direction length of 50 to 150 nm.

In a preferable embodiment of the magnetoresistive device of the invention, the substantially orthogonal intersection of magnetizations of said first and second ferromagnetic layers is in the range of 90°±15°.

The invention also provides a thin-film magnetic head, comprising a plane in opposition to a recording medium, and the aforesaid magneto-resistive effect, which is located near said medium opposite plane to detect a signal magnetic field from said recording medium.

Further, the invention provides a head gimbal assembly, comprising a slider including the aforesaid thin-film magnetic head and located in such a way as to oppose to a recording medium, and a suspension adapted to resiliently support said slider.

Yet further, the invention provides a magnetic disk system, comprising a slider including the aforesaid thin-film magnetic head and located in such a way as to oppose to a recording medium, and a positioning device adapted to support and position said slider with respect to said recording medium.

EXPLANATION OF THE PREFERRED EMBODIMENTS

Figure 1:
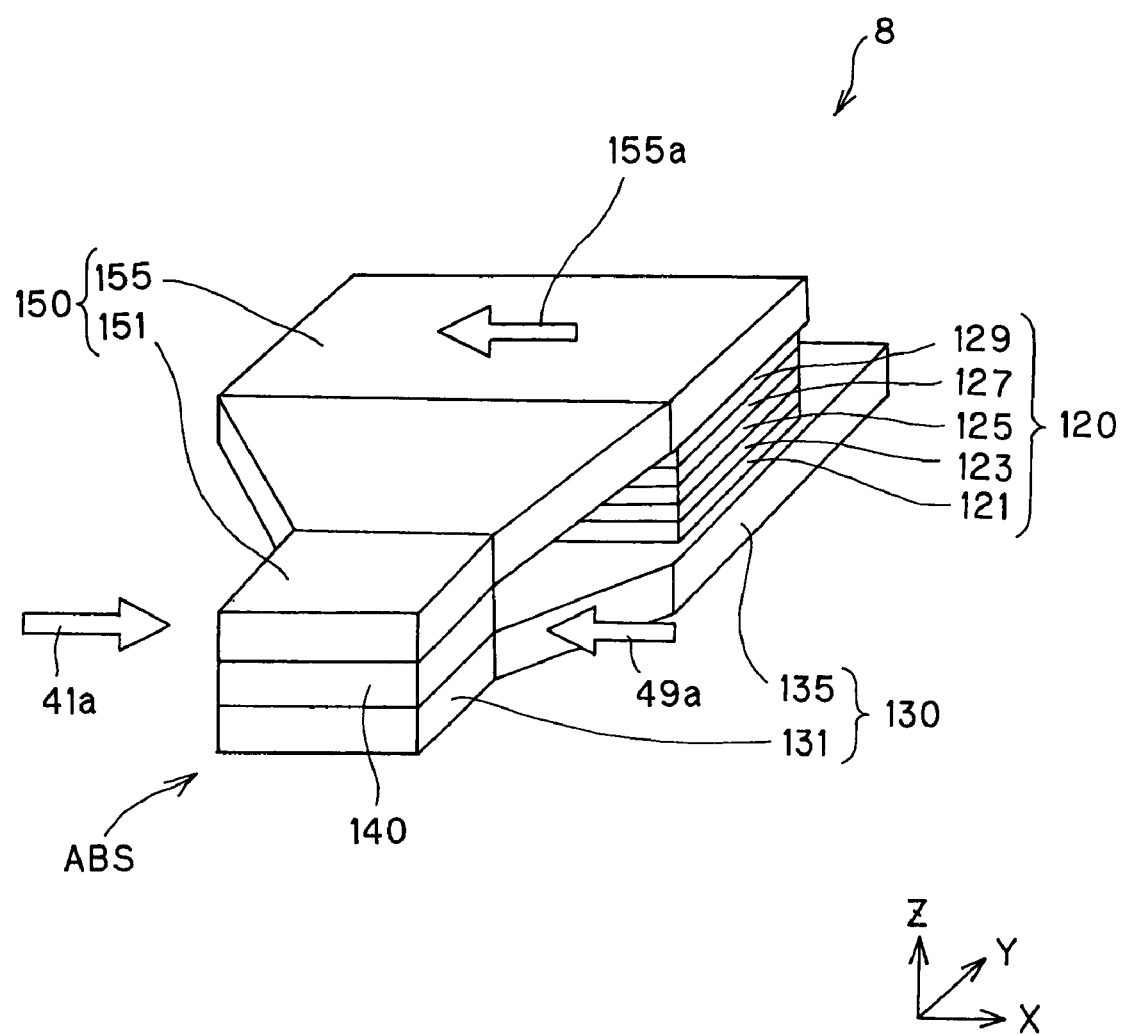
FIG. 1 is illustrative in schematic and perspective of the magnetoresistive device with the CPP structure (CPP-MR device) that is part of the invention, as viewed from the ABS.

The best mode for carrying out the invention is now explained in greater details.

The magnetoresistive device 8 of the invention is preferably used with a thin-film magnetic head in general and a reproducing head in particular.

In the following disclosure of the invention, the sizes of each device component in the X-, Y- and Z-axis directions shown in the drawings will be referred to as the "width", "length" and "thickness", respectively. The side of the device nearer to the air bearing surface (the plane of the thin-film magnetic head in opposition to the recording medium) in the Y-axis direction will be called "forward" and the opposite side (depth side) will be called "rearward", and the direction of stacking the individual films up will be called "upward" or "upper side" and the opposite direction will be called "downward" or "lower side".

FIG. 1 is illustrative in schematic and perspective of the magnetoresistive device with the CPP structure (CPP-MR device) that is part of the invention, as viewed from the ABS. The ABS is generally corresponding to a plane (hereinafter often called the medium opposite plane) at which the reproducing head lies in opposition to the recording medium; however, it is understood that the ABS here includes even a section at a position where the multilayer structure of the device can be clearly observed. For instance, a protective layer of DLC (the protective layer adapted to cover the device) or the like, in a strict sense, positioned facing the medium opposite plane may be factored out, if necessary.

Figure 2:
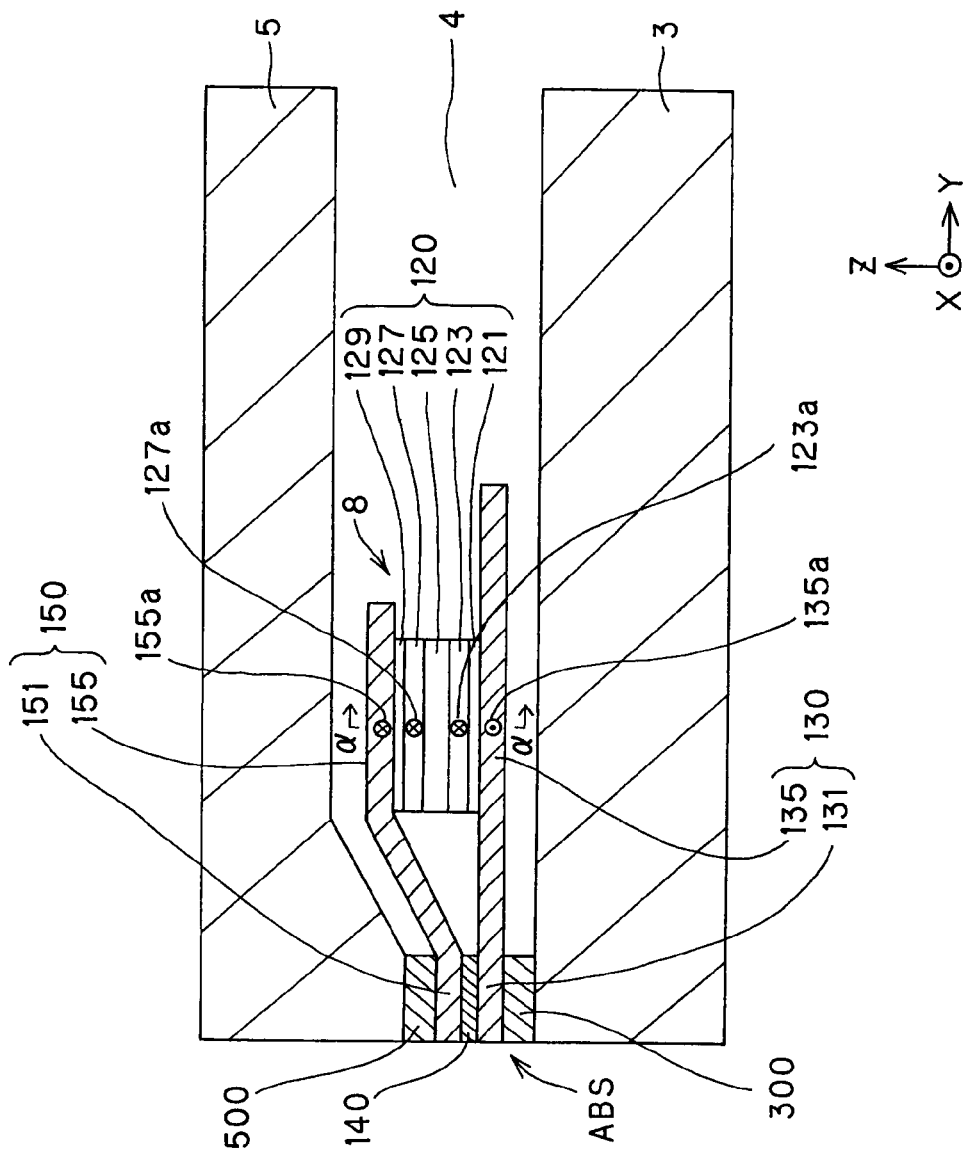
FIG. 2 is a view corresponding to a Y-Z plane sectional view of the magnetic head including the magnetoresistive device of FIG. 1.

FIG. 2 is a view corresponding to a Y-Z plane sectional view of the magnetic head including the magnetoresistive device of FIG. 1.

Figure 3:
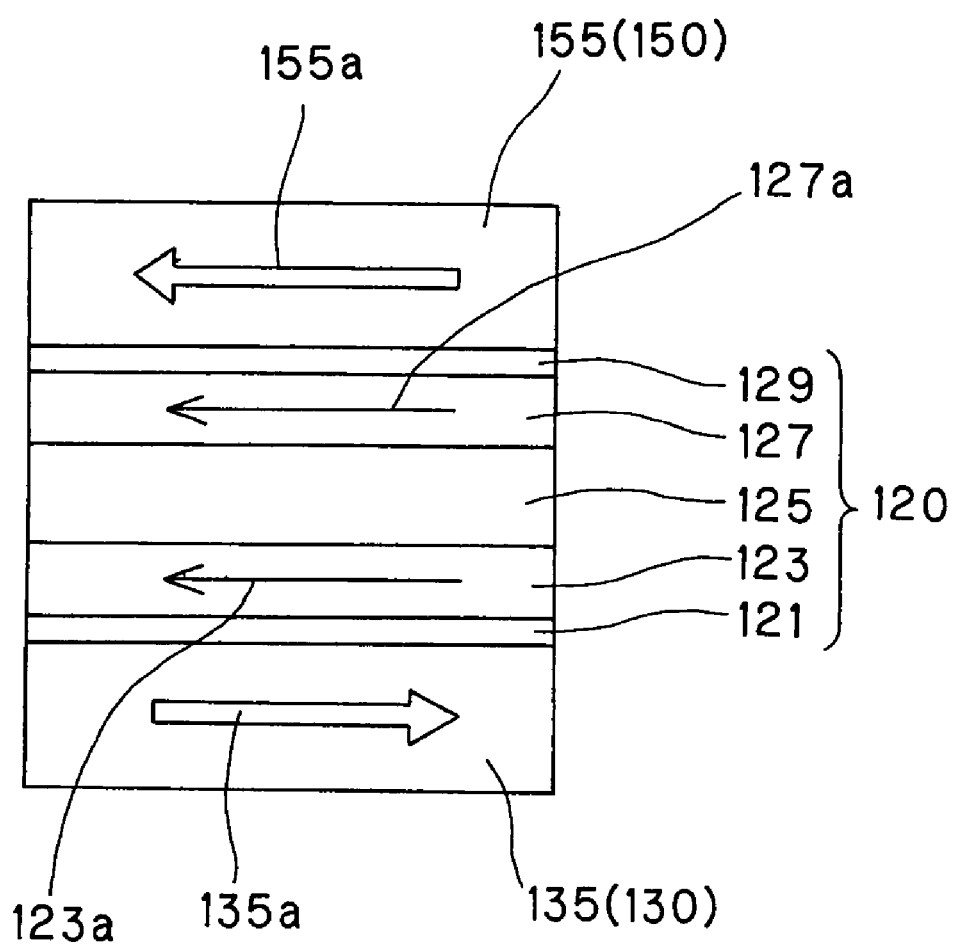
FIG. 3 is an X-Z plane sectional view of the magnetoresistive device, as taken on an arrowed $\alpha$-$\alpha$ section of FIG. 2.

FIG. 3 is an X-Z plane sectional view of the magnetoresistive device, as taken on an arrowed α-α section of FIG. 2.

Figure 4:
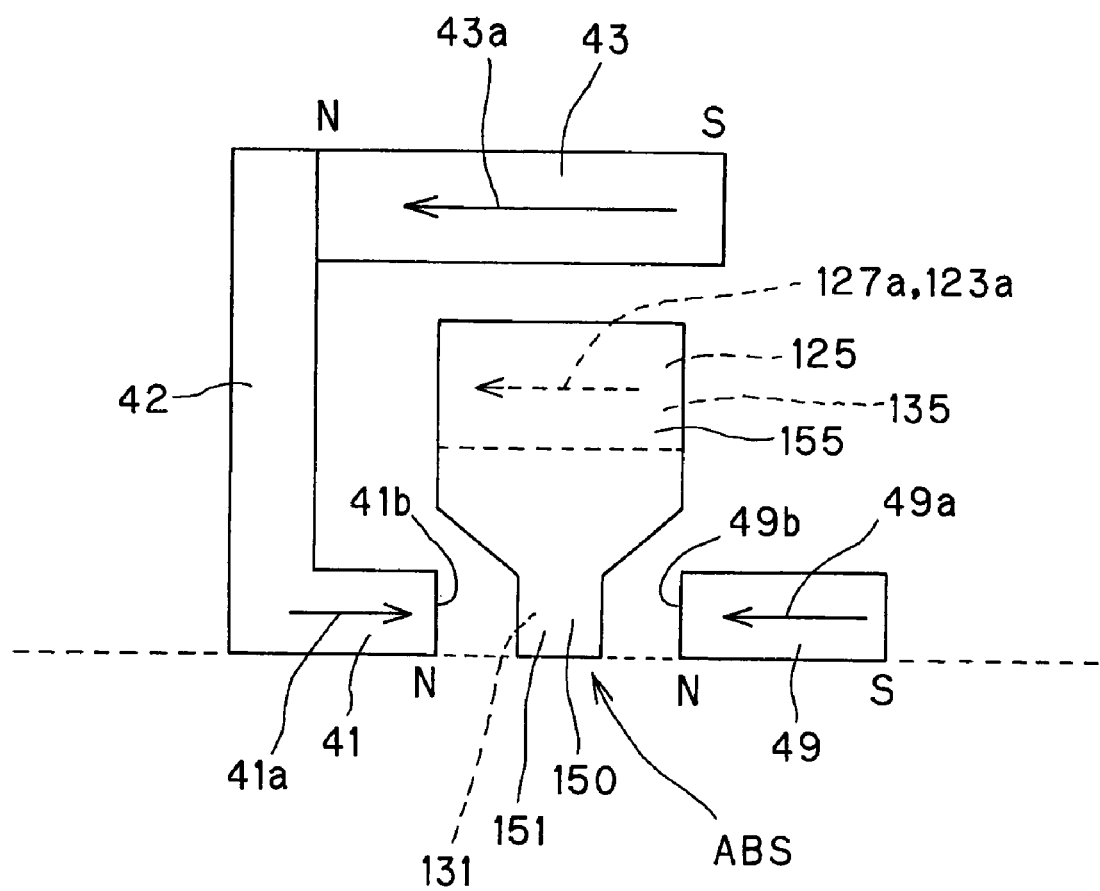
FIG. 4 is a schematic plan view for the illustration of a preferable, exemplary arrangement of how to locate the magnetoresistive device and biasing layers.

FIG. 4 is a schematic plan view for the illustration of a preferable, exemplary arrangement of how to locate the magnetoresistive device and biasing layers.

Figure 5A:
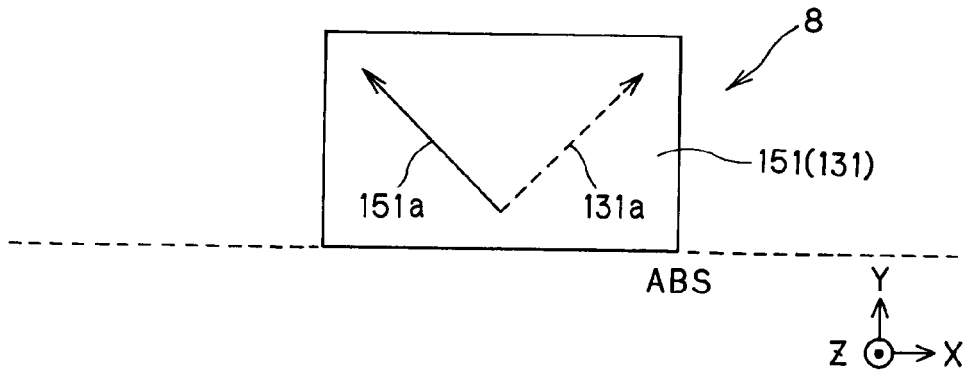
FIGS. 5A, 5B and 5C are models indicative of external magnetic field-depending changes in the state of magnetization where changes in the magneto-resistive effect of the inventive magnetoresistive device are obtainable.
Figure 5B:
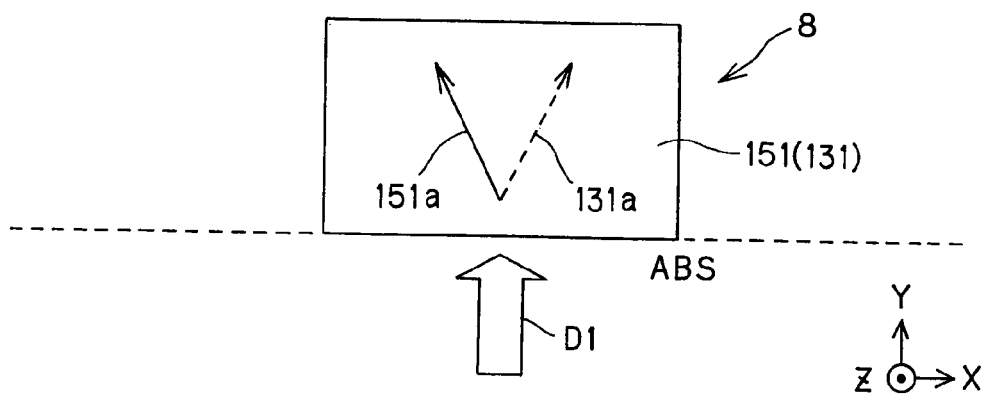
Figure 5C:
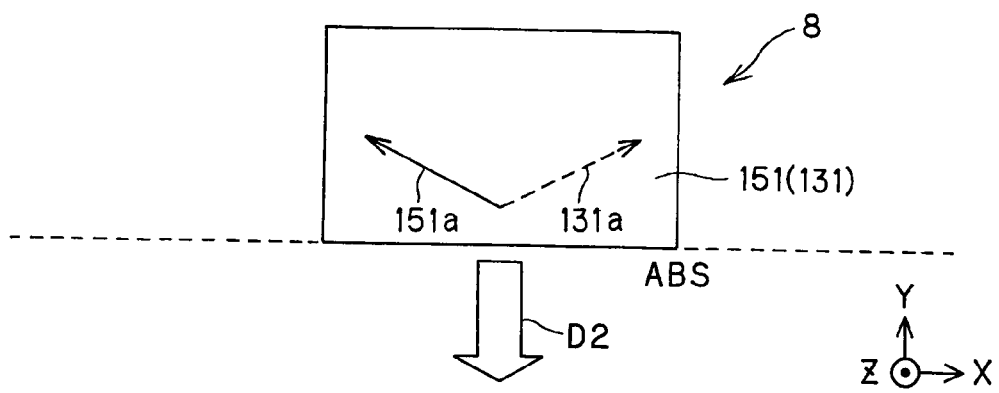

FIGS. 5A, 5B and 5C are models indicative of external magnetic field-depending changes in the state of magnetization where changes in the magneto-resistive effect of the inventive magnetoresistive device are obtainable.

[Explanation of the Structure of the Magnetoresistive Device]

As shown in FIG. 1, the magnetoresistive device 8 of the invention is with the CPP (current perpendicular to plane) structure comprising a nonmagnetic intermediate layer 140, and a first 130 and a second ferromagnetic layer 150 stacked and formed such that the nonmagnetic intermediate layer 140 is sandwiched between them, with a sense current applied in the stacking direction.

As shown in FIG. 1, the first ferromagnetic layer 130 comprises a portion extending further rearward (Y-direction) from the rear end of the nonmagnetic intermediate layer 140, and is configured in the form of a member larger than the non-magnetic intermediate layer 140. More specifically, the first ferromagnetic layer 130 comprises, and is made up of, a sensor area 131 joining to the nonmagnetic intermediate layer 140 near the medium opposite plane (ABS), and a magnetization direction control area 135 extending further rearward (toward the depth side) from the position of the rear end of the nonmagnetic intermediate layer 140. In the invention, it is noted that the rest of the first ferromagnetic layer 130 except the sensor area 131 joining to the nonmagnetic intermediate layer 140 is defined as the magnetization direction control area 135.

As is the case with the first ferromagnetic layer 130, the second ferromagnetic layer 150, too, comprises a portion extending further rearward (Y-direction) from the rear end of the nonmagnetic intermediate layer 140, and is configured in the form of a member larger than the non-magnetic intermediate layer 140. More specifically, the second ferromagnetic layer 150 comprises, and is made up of, a sensor area 151 joining to the nonmagnetic intermediate layer 140 near the medium opposite plane (ABS), and a magnetization direction control area 155 extending further rearward (toward the depth side) from the position of the rear end of the nonmagnetic intermediate layer 140. In the invention, it is noted that the rest of the second ferromagnetic layer 150 except the sensor area 151 joining to the nonmagnetic intermediate layer 140 is defined as the magnetization direction control area 155.

There are substantially parallel, opposite space areas defined by such magnetization control areas 155 and 135 for the aforesaid second 150 and first ferromagnetic layer 130, and a magnetization direction control multilayer arrangement 120 (hereinafter called the control multilayer arrangement 120 for short) is interposed between such space areas.

The control multilayer arrangement 120 is formed for the purpose of permitting the whole magnetizations of the first 130 and the second ferromagnetic layer 150 to be antiparallel with each other along the axis (viz., the X-axis of the drawing) in the width direction. To this end, each of the first 130 and the second ferromagnetic layer 150 is of size enough to have a so-called "single domain structure", so that the whole magnetization directions of the first 130 and the second ferromagnetic layer 150 can be adjusted by the adjustment of magnetization directions of the magnetization direction control areas 135 and 155. More specifically in terms of X-Y plane size, the width (X-direction) is 20 to 100 nm, and the depth direction length (Y-direction) is 50 to 150 nm.

As shown in FIGS. 2 and 3, the control multilayer arrangement 120 used herein comprises, and is made up of, in order from the side of the magnetization direction control space 135 of the first ferromagnetic layer 130, a first exchange coupling transfer layer 121, a first fixed magnetization layer 123, an antiferromagnetic layer 125, a second fixed magnetization layer 127, and a second exchange coupling transfer layer 129. On the second exchange coupling transfer layer 129 there is the magnetization direction control area 155 for the second ferromagnetic layer 150 formed.

[Explanation of the Control Multilayer Structure 120]

As shown in FIG. 3, the antiferromagnetic layer 125 positioned at substantially the center of the control multilayer arrangement 120 works to fix the directions of the magnetizations of the first 123 and the second fixed magnetization layer 127 in contact with both planes of the antiferromagnetic layer 125. By the magnetization fixing action of the antiferromagnetic layer 125, the directions of the magnetizations of the first 123 and the second fixed magnetization layer 127 are fixed in the same width direction (X-direction): the magnetization direction 123a of the first fixed magnetization layer 123 and the magnetization direction 127a of the second fixed magnetization layer 127 are fixed in the same direction along the X-direction axis. In FIG. 2, the magnetization direction 123a of the first fixed magnetization layer 123 and the magnetization direction 127a of the second fixed magnetization layer 127 lie in the direction coming in the paper.

As shown in FIG. 3, the first fixed magnetization layer 123 in the embodiment here is antiferromagnetically coupled to the magnetization direction control area 135 for the first ferromagnetic layer 130 by way of the first exchange coupling transfer layer 121: that magnetic coupling takes place with the magnetization direction 123a of the first fixed magnetization layer 123 and the magnetization direction 135a of the magnetization direction control area 135 for the first ferromagnetic layer 130 lying in the opposite directions. It is noted that whether the first fixed magnetization layer 123 is antiferromagnetically coupled to the magnetization direction control area 135 for the first ferromagnetic layer 130, and the strength of coupling, if this is the case, is determined by what material is selected for the first exchange coupling transfer layer 121 and what thickness it is set at. In other words, the material and film thickness for the first exchange coupling transfer layer 121 must appropriately be selected in such a way as to ensure antiferromagnetic coupling.

As shown in FIG. 3, on the other hand, the second fixed magnetization layer 127 in the embodiment here is ferromagnetically coupled to the magnetization direction control area 155 for the second ferromagnetic layer 150 by way of the second exchange coupling transfer layer 129: that magnetic coupling occurs such that the magnetization direction 127a of the second fixed magnetization layer 127 and the magnetization layer 155a of the magnetization direction control area 155 for the second ferromagnetic layer 150 lie in the same direction. It is noted that whether the first fixed magnetization layer 127 is ferromagnetically coupled to the magnetization direction control area 155 for the second ferromagnetic layer 150, and the strength of coupling, if this is the case, is determined by what material is selected for the second exchange coupling transfer layer 129 and what thickness it is set at. In other words, the material and film thickness for the second exchange coupling transfer layer 129 must appropriately be selected in such a way as to ensure ferromagnetic coupling.

If the control multilayer arrangement 120 is designed as described above, the magnetization direction 135a of the magnetization direction control area 135 for the first ferromagnetic layer 130 and the magnetization direction 155a of the magnetization direction control area 155 for the second ferromagnetic layer 150 are anti-parallel with each other along the axis in the width direction (X-direction). Because the first 130 and the second ferromagnetic layer 150 are each of size enough to have the single domain structure, the whole magnetization directions of them are straightforward affected by the magnetization directions of the magnetization direction control areas 135 and 155. Consequently, the magnetization directions of the sensor areas 131 and 151 for the first 130 and the second ferromagnetic layer 150 are antiparallel with each other along the axis in the width direction (X-direction), as is the case with the magnetization direction control areas 135 and 155.

In the invention, it is noted that what is needed in the absence of bias magnetic fields is just that the magnetizations of the first 130 and the second ferromagnetic layer 150 are antiparallel with each other along the axis in the width direction (X-direction). In the first modification to the structure shown in FIG. 3, therefore, the multilayer film structure may be designed such that all the arrowed directions shown in FIG. 3 are the opposite. In the second modification to the structure shown in FIG. 3, the first fixed magnetization layer 123 may be ferromagnetically coupled to the magnetization direction control area 135 for the first ferromagnetic layer 130 with antiferromagnetic coupling of the second fixed magnetization layer 127 to the magnetization direction control area 155 for the second ferromagnetic layer 150.

On the lower side of the sensor area 131 and on the upper side of the sensor area 151 in the thus formed magnetic magnetoresistive device, there are respectively a buffer layer 300 and a cap layer 500 formed, one each made of Ta, Ru or the like, as shown in FIG. 2. Above and below such multilayer structures there are an upper shield layer 5 and a lower shield layer 3 disposed, and at the rear of the magnetoresistive device there is a nonmagnetic insulating layer 4 formed as a refill layer. For the material of the aforesaid second exchange coupling transfer layer 129, it is desired to use the same material for the nonmagnetic insulating layer 4, because of simplification of the production process involved. For instance, there is the mention of MgO, Al$_2$O$_3$, HfO, and SiON. All such materials at a given film thickness could work achieving the ferromagnetic coupling of two magnetic layers with one each held between them.

Further, as shown in FIG. 4, biasing layers 41 and 49 are disposed and formed at both ends in the width direction (X-direction) of the sensor areas 131 and 151, respectively. And by magnetic fluxes given out of such biasing layers 41, 49, the directions of the magnetizations of the sensor areas 131 and 151 for the first 130 and the second ferromagnetic layers 150—antiparallel with each other along the axis in the width direction (X-direction)—are permitted to intersect substantially orthogonally. The "substantially orthogonal intersection" takes place in the range of 90°±15°. It is in the state of intersection of the magnetizations 131a and 151a shown in FIG. 5A that the substantially orthogonal intersection is achieved.

As shown in FIG. 4, the ends 41b and 49b of the biasing layers 41 and 49 near the sensor areas 131 and 151 have the same magnetic pole (N-pole in the illustrated embodiment), and the bias magnetic fields are applied from both biasing layer 41 and 49 in mutually opposite directions along the width direction (X-direction) (the magnetization direction 41a of the biasing layer 41; the magnetization direction 49a of the biasing layer 49).

One biasing layer 41 shown in FIG. 4 is connected to a magnet layer 43 that is a bias magnetic field application source extending in the X-direction by way of a magnetic member 42 connected to the rear end of the layer 41 and extending in the Y-direction. The magnet layer 43 that is the source for feeding the bias magnetic field that must be supplied is built up of a hard magnetic layer or a multilayer structure of an anti-ferromagnetic layer and a magnetic member. The magnet layer 43 feeds a magnetic flux to the biasing layer 41 that is a magnetic material by way of the magnetic member 42.

Another biasing layer 49 shown in FIG. 4 is built up of a hard magnetic layer or a multilayer structure of an antiferromagnetic layer and a magnetic member. In the general magnetic location and device structure shown in FIG. 4, the magnet components that must be heated in a magnetic field for magnetization are a magnet indicated by reference numeral 43, a biasing layer indicated by 49, and an antiferromagnetic layer indicated by 125 and incorporated in the rear of the device. With the magnetization operation, the magnetic field is applied in the width direction (X-direction) alone in FIG. 4. Therefore, the desired magnetization may be obtained in one single magnetization operation.

It is here noted that the magnet 43 and magnetic member 42 may be removed or taken out to set up a simple biasing layer structure 41 (similar in configuration to the biasing layer 49). Then, this biasing layer 41 may just as well be made up of either a hard magnetic layer or a multilayer structure of an antiferromagnetic layer and a magnetic member. In this case, however, double magnetization operations must be carried out, one in the positive direction and one in the minus direction along the axis in the X-direction.

[Explanation of the Material for Each of the Components Forming the Magnetoresistive Device]

Reference is now made to the material for each of the components that form the aforesaid magnetoresistive device.

First 130 and Second Ferromagnetic Layer 150:

There is the mention of materials such as NiFe, CoFe, CoFeB, CoFeNi, Co$_2$MnSi, Co$_2$MnGe, FeO$_x$ (the oxide of Fe), and CoO$_x$ (the oxide of Co).

Each layer has a thickness of about 0.5 to 8 nm.

These layers function as a so-called free layer with its direction of magnetization changing under the influences of an externally applied magnetic field.

Nonmagnetic Metal Intermediate Layer 140:

The nonmagnetic intermediate layer 140 is the film essentially required to let the so-called MR effect show up, and is typically made of Cu, Au, Ag, Zn, Ga, TiO$_x$, ZnO, InO, SnO, GaN, ITO (indium tin oxide), Al$_2$O$_3$, and MgO. In a preferable embodiment, the nonmagnetic intermediate layer 140 is formed of a multilayer structure comprising two or more layers, for instance, a triple-layer structure film of Cu/ZnO/Cu. A triple-layer structure film of Cu/ZnO/Zn with Cu replaced by Zn is also preferable because of boosted-up output.

The nonmagnetic intermediate layer 140 has a thickness of about 0.5 to 5 nm.

Control Multilayer Arrangement 120:

(i) Antiferromagnetic Layer 125

The antiferromagnetic layer 125 works such that by way of exchange coupling with the first 123 and the second fixed magnetization layer 127, the directions of their magnetizations remain fixed.

For instance, the antiferromagnetic layer 125 is made of an antiferromagnetic material containing at least one element M' selected from the group of Pt, Ru, Rh, Pd, Ni, Cu, Ir, Cr and Fe, and Mn. The content of Mn is preferably 35 to 95 at %. The antiferromagnetic material is broken down into two types: (1) a non-heat treatment type antiferromagnetic material that shows anti-ferromagnetism even in the absence of heat treatment to induce an exchange coupling magnetic field between it and a ferromagnetic material, and (2) a heat treatment type antiferromagnetic material that is going to show anti-ferromagnetism by heat treatment. In the invention, both types (1) and (2) may be used without restriction. For instance, the non-heat treatment type antiferromagnetic material is exemplified by RuRhMn, FeMn, and IrMn, and the heat treatment type antiferromagnetic material is exemplified by PtMn, NiMn, and PtRhMn.

The antiferromagnetic layer 125 has a thickness of about 3 to 30 nm.

(ii) First 123 and Second Fixed Magnetization Layer 127

The first 123 and the second fixed magnetization layer 127 may be made of a soft magnetic material containing Fe or Co as a main component, or a material such as Heusler alloy.

Each layer has a thickness of about 1 to 5 nm.

(iii) First 121 and Second Exchange Coupling Transfer Layer 129

The first exchange coupling transfer layer 121 is made of at least one material selected from the group consisting of Ru, Rh, Ir, Cr, Cu, Ag, Au, Pt, Pd, MgO, and $Al_2O_3$: it is capable of adjusting the strength of magnetic coupling of the magnetization direction 123a of the first fixed magnetization layer 123 to the magnetization direction 135a of the magnetization direction control area 135 for the first ferromagnetic layer 130, and whether there is antiferromagnetic coupling (where the magnetizations are magnetically coupled together in the opposite directions) or ferromagnetic coupling (where the magnetizations are magnetically coupled together in the same direction) is determined, depending on what material is selected and what thickness it has.

Likewise, the second exchange coupling adjustment layer 129 is made of at least one material selected from the group consisting of Ru, Rh, Ir, Cr, Cu, Ag, Au, Pt, Pd, MgO, and $Al_2O_3$: it is capable of adjusting the strength of magnetic coupling of the magnetization direction 127a of the second fixed magnetization layer 127 to the magnetization direction 155a of the magnetization direction control area 155 for the second ferromagnetic layer 150, and whether there is antiferromagnetic coupling (where the magnetizations are magnetically coupled together in the opposite directions) or ferromagnetic coupling (where the magnetizations are magnetically coupled together in the same direction) is determined, depending on what material is selected and what thickness it has.

[Explanation of Each of the Components that Constitute the Rest of the Magnetoresistive Device]

Lower 3 and Upper Shield Layer 5

There is the mention of NiFe, CoZrTa, sendust, NiFeCo, CoZrNb, etc. Each layer acts as a magnetic shield, and has usually an electrode function as well.

The thickness is of the order of 20 nm to 3 μm.

Magnet Layer 43 and Biasing Layer 49 as Bias Magnetic Field-Applying Source

The magnet layer 43 and biasing layer 40 that are the biasing layer shown in FIG. 4 are each made of the same material for the aforesaid antiferromagnetic layer 125 or a hard magnet material such as CoPt, and CoCrPt.

Nonmagnetic Layer 4

There is the mention of $Al_2O_3$, $SiO_2$, $SiO_xN_y$, MgO, $HfO_2$, $TiO_2$, DLC (diamond-like carbon), and so on. When the nonmagnetic layer 4 is made of the same material for the aforesaid second exchange coupling transfer layer 129, it is desired to use MgO, and $Al_2O_3$.

[Explanation of the Operation of the Magnetoresistive Device]

The operation of the magnetoresistive device of the invention is now explained with reference to FIGS. 3 as well as 5A, 5B and 5C.

With no bias magnetic field applied as yet, the first 130 and the second ferromagnetic layer 150 have an antiparallel magnetization state where their magnetizations 135a and 155a are antiparallel with each other, as shown in FIG. 3. The first 130 and the second ferromagnetic layer 150 are each of size enough to have a single domain structure: the sensor areas 131 and 151 for the first 130 and the second ferromagnetic layer 150, too, are each in an antiparallel state where states similar to the magnetizations 135a and 155a are maintained.

Bias magnetic fields are applied to the aforesaid sensor areas 131 and 151 from the biasing layers 41 and 49 formed at both ends of such sensor areas 131 and 151 in the width direction, so that the magnetizations 131a and 151a of the sensor areas 131 and 151 for the first 130 and the second ferromagnetic layers 150 are placed in substantially orthogonal directions, creating such a state as shown in FIG. 5A. This state defines the initial state of the sensor site in the magnetoresistive device (the magnetoresistive unit 8).

As an external magnetic field D1 flowing from the ABS into the device side is detected as shown in FIG. 5B, both the magnetizations 131a and 151a of the sensor areas 131 and 151 for the first 130 and the second ferromagnetic layer 150 tend to lie in the same direction so that the resistance of the device gets low.

On the other hand, as an external magnetic field D2 in a direction away from the ABS is detected as shown in FIG. 5C, the magnetizations 131a and 151a of the sensor areas 131 and 151 for the first 130 and the second ferromagnetic layer 150 tend to lie in the opposite directions so that the resistance of the device grows high.

By measuring such a series of resistance changes with the external magnetic field, it is possible to detect the external magnetic field.

[Explanation of the Whole Structure of the Thin-Film Magnetic Head]

Figure 6:
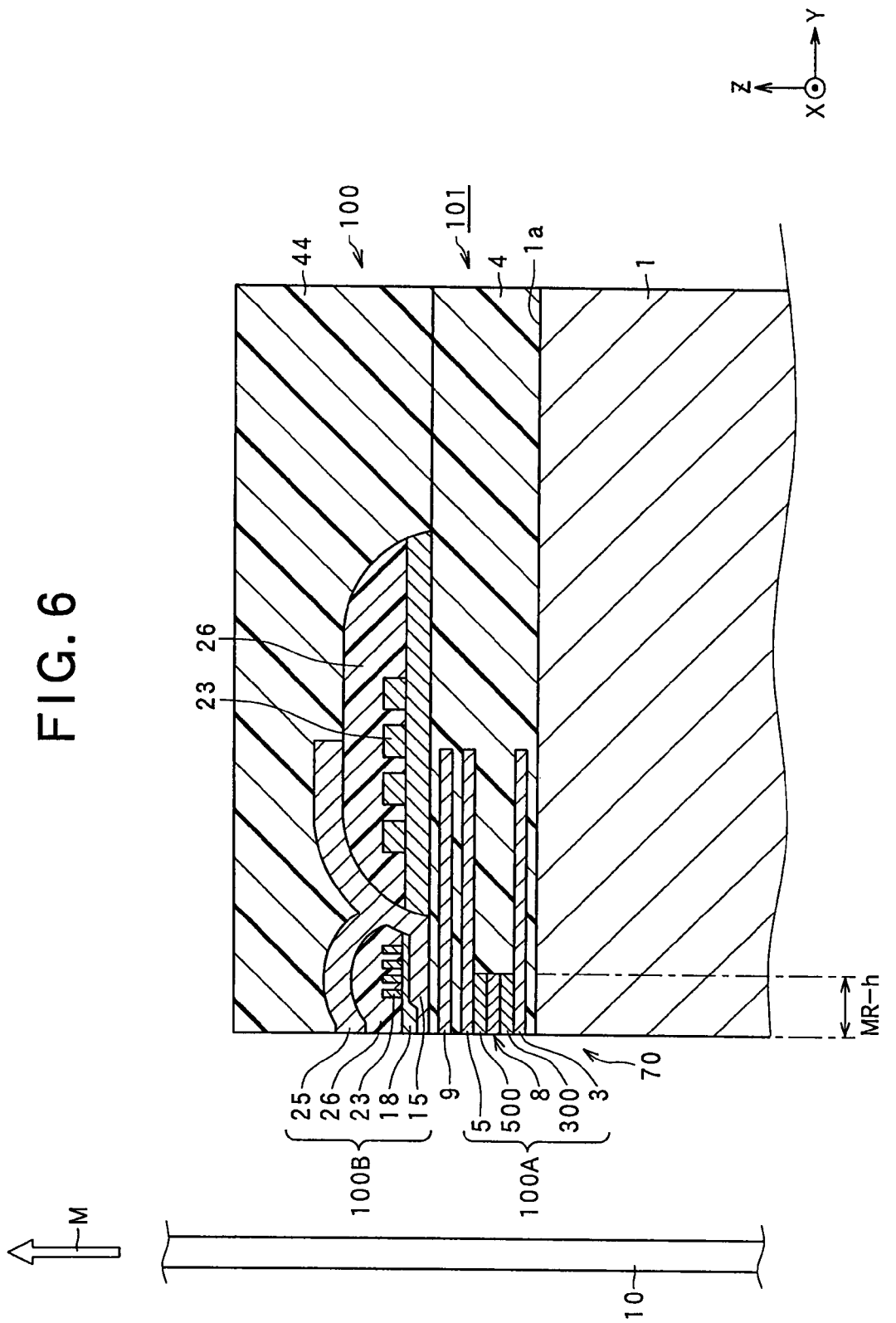
FIG. 6 is illustrative in section of the thin-film magnetic head parallel with the so-called air bearing surface (ABS).

FIG. 6 is illustrative in section (section in the Y-Z plane) of the thin-film magnetic head parallel with the so-called air bearing surface (ABS).

A thin-film magnetic head 100 shown in FIG. 6 is used on a magnetic recording system such as a hard disk drive for the purpose of applying magnetic processing to a recording medium 10 like a hard disk moving in a medium travel direction M.

The thin-film magnetic head 100 illustrated in the drawing is a composite type head capable of implementing both recording and reproducing as magnetic processing. The structure comprises, as shown in FIG. 6, a slider substrate 1 made of a ceramic material such as AlTiC ($Al_2O_3$.TiC), and a magnetic head unit 101 formed on the slider substrate 1.

The magnetic head unit 101 has a multilayer structure comprising a reproducing head portion 100A adapted to implement reproducing process for magnetic information recorded by making use of the magneto-resistive (MR) effect and a shield type recording head portion 100B adapted to implement a perpendicular recording type recording processing.

A detailed account is now given below.

A first shield layer 3 and a second shield layer 5 are each a planar layer formed in such a way as to be almost parallel with the side 1a of the slider substrate 1, forming a part of the ABS that is a medium opposite plane 70.

A magnetoresistive device 8 is disposed in such a way as to be held between the first 3 and the second shield layer 5, forming a part of the medium opposite plane 70. And a height in the perpendicular direction (Y-direction) to the medium opposite plane 70 defines an MR height (MR-h).

For instance, the first 3 and the second shield layer 5 are each formed by pattern plating inclusive of frame plating or the like.

The magnetoresistive device 8 is a multilayer film formed in such a way as to be almost parallel with the side 1a of the slider substrate 1, forming a part of the medium opposite surface 70.

The magnetoresistive device 8 is a multilayer film of the current-perpendicular-to-plane type (CPP type) with a sense current passing in the direction perpendicular to the staking plane.

As shown in FIG. 6, between the second shield layer 5 and the recording head portion 100B there is an inter-device shield layer 9 formed that is made of a similar material as the second shield layer 5 is.

The inter-device shield layer 9 keeps the magnetoresistive device 8 functioning as a sensor out of a magnetic field occurring from the recording head portion 100B, taking a role in prevention of extraneous noises upon reading. Between the inter-device shield layer 9 and the recording head portion 100B there may also be a backing coil portion formed. The backing coil portion is to generate a magnetic flux that cancels out a magnetic flux loop that is generated from the recording head portion 100B, passing through the upper and lower electrode layers of the magnetoresistive device 8: this backing coil portion works to hold back the wide adjacent track erasure (WATE) phenomenon that is unwanted writing or erasure operation with the magnetic disk.

At a gap between the first and second shield layers 3 and 5 on the side of the magnetoresistive device 8 that faces away from the medium opposite plane 70, at the rear of the first and second shield layers 3, 5 and the inter-shield shield layer 9 that face away from the medium opposite plane 70, at a gap between the first shield layer 3 and the slider substrate 1, and at a gap between the inter-device shield layer 9 and the recording head portion 100B, there are insulating layers 4 and 44 formed, one each made of alumina or the like.

The recording head portion 100B is preferably constructed for the purpose of perpendicular magnetic recording, and comprises a main magnetic pole layer 15, a gap layer 18, a coil insulating layer 26, a coil layer 23 and an auxiliary magnetic pole layer 25, as shown in FIG. 6.

The main magnetic pole layer 15 is set up as a magnetic guide path for guiding a magnetic flux induced by the coil layer 23 to the recording layer of the magnetic recording medium 10 with information being to be written on it while converging that magnetic flux. At the end of the main magnetic pole layer 15 here that is on the medium opposite plane 70 side, the width in the track width direction (along the X-axis of FIG. 6) and thickness in the stacking direction (along the Z-axis of FIG. 6) of the main magnetic pole layer 15 should preferably be less than those of the rest. Consequently, it is possible to generate a fine yet strong writing magnetic flux well fit for high recording densities.

The end on the medium opposite plane 70 side of the auxiliary magnetic pole layer 25 magnetically coupled to the main magnetic pole layer 15 forms a trailing shield portion having a layer section wider than that of the rest of the auxiliary magnetic pole layer 25. As shown in FIG. 6, the auxiliary magnetic pole layer 25 is opposed to the end of the main magnetic pole layer 15 on the medium opposite plane 70 side while the gap layer 18 made of an insulating material such as alumina and the coil insulating layer 26 are interposed between them.

By the provision of such auxiliary magnetic pole layer 25, it is possible to make steeper a magnetic field gradient between the auxiliary magnetic pole layer 25 and the main magnetic pole layer 15 near the medium opposite plane 70. Consequently, jitters of signal outputs diminish, resulting in the ability to minimize error rates upon reading.

The auxiliary magnetic pole layer 25, for instance, is formed at a thickness of, e.g., about 0.5 to 5 μm using frame plating, sputtering or the like. The material used may be an alloy comprising two or three of, for instance, Ni, Fe and Co, or comprising them as a main component with the addition of given elements to it.

The gap layer 18 is formed in such a way as to space the coil layer 23 away from the main magnetic pole layer 15. The gap layer 18 is constructed from $Al_2O_3$, DLC (diamond-like carbon) or the like having a thickness of, for instance, about 0.01 to 0.5 μm, and formed using, for instance, sputtering, CVD or the like.

[Explanation of the Head Gimbal Assembly and the Hard Disk System]

One each example of the head gimbal assembly and the hard disk system, used with the foregoing thin-film head mounted on it, is now explained.

A slider 210 included in the head gimbal assembly is first explained with reference to FIG. 7. In the hard disk system, the slider 210 is located in such a way as to face a hard disk that is a rotationally driven disk-form recording medium. This slider 210 primarily comprises a substrate 211 built up of a substrate and an overcoat.

The substrate 211 is in a generally hexahedral shape. Of the six surfaces of the substrate 211, one surface is in opposition to the hard disk. On that one surface there is a medium opposite plane 70 formed.

Figure 7:
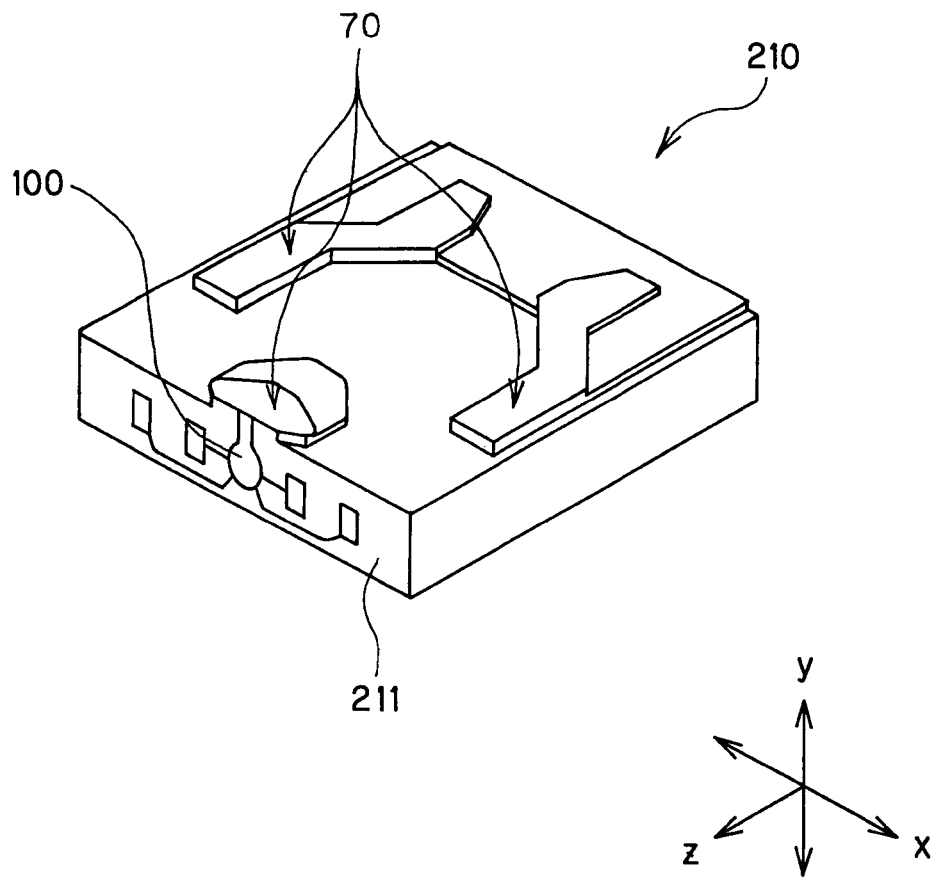
FIG. 7 is illustrative in perspective of the slider included in the head gimbal assembly according to one embodiment of the invention.

As the hard disk rotates in the z-direction in FIG. 7, it causes an air flow passing between the hard disk and the slider 210 to induce lift relative to the slider 210 in the downward y-direction in FIG. 7. This lift in turn causes the slider 210 to levitate over the surface of the hard disk. Note here that the x direction in FIG. 7 traverses tracks on the hard disk.

Near the end of the slider 210 on an air exit side (the left lower end in FIG. 7), there is a thin-film magnetic head formed according to the embodiment here.

A head gimbal assembly 220 according to this embodiment is now explained with reference to FIG. 8. The head gimbal assembly 220 comprises a slider 210 and a suspension 221 adapted to resiliently support that slider 210. The suspension 221 comprises a leaf spring-form load beam 222 made of typically stainless steel, a flexure 223 attached to one end of the load beam 222 and having the slider 210 joined to it for giving a suitable degree of flexibility to the slider 210, and a base plate 224 attached to the other end of the load beam 222.

The base plate 224 is adapted to be attached to an arm 230 of an actuator for moving the slider 210 in the track traverse direction x of the hard disk 262. The actuator comprises the arm 230 and a voice coil motor for driving that arm 230. At a portion of the flexure 223 having the slider 210 attached to it, there is a gimbal portion provided for keeping the posture of the slider 210 constant.

The head gimbal assembly 220 is attached to the arm 230 of the actuator. The head gimbal assembly 220 attached to one arm 230 is called a head arm assembly, whereas the head gimbal assembly 220 attached to a carriage at its plurality of arms is referred to as a head stack assembly.

Figure 8:
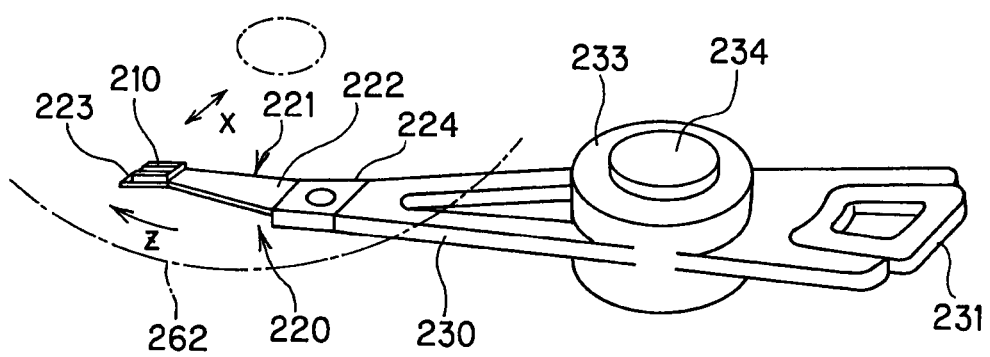
FIG. 8 is illustrative in perspective of the head arm assembly comprising the head gimbal assembly according to one embodiment of the invention.

FIG. 8 illustrates one example of the head arm assembly, wherein the head gimbal assembly 220 is attached to one end of the arm 230. To the other end of the arm 230, a coil 231 forming a part of the voice coil motor is attached. Halfway across the arm 230, there is a bearing portion 233 attached to a shaft 234 adapted to support the arm 230 in a pivotal fashion.

One each example of the head stack assembly and the hard disk system according to the embodiment here is now explained with reference to FIGS. 9 and 10.

Figure 9:
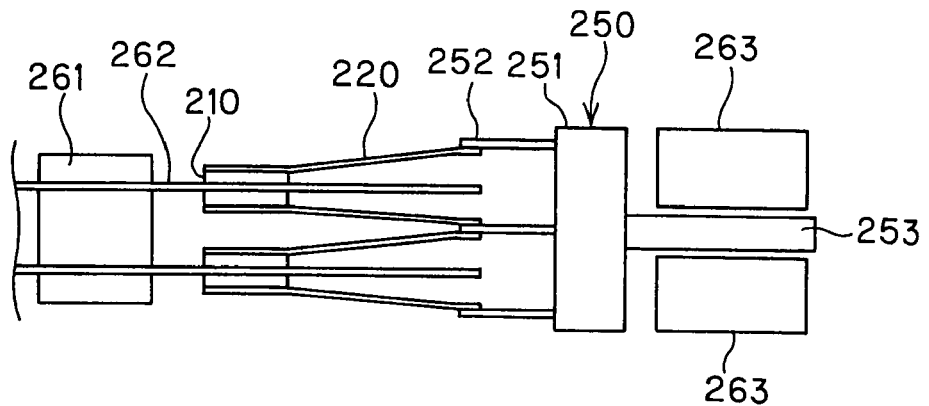
FIG. 9 is illustrative of part of the hard disk system according to one embodiment of the invention.
Figure 10:
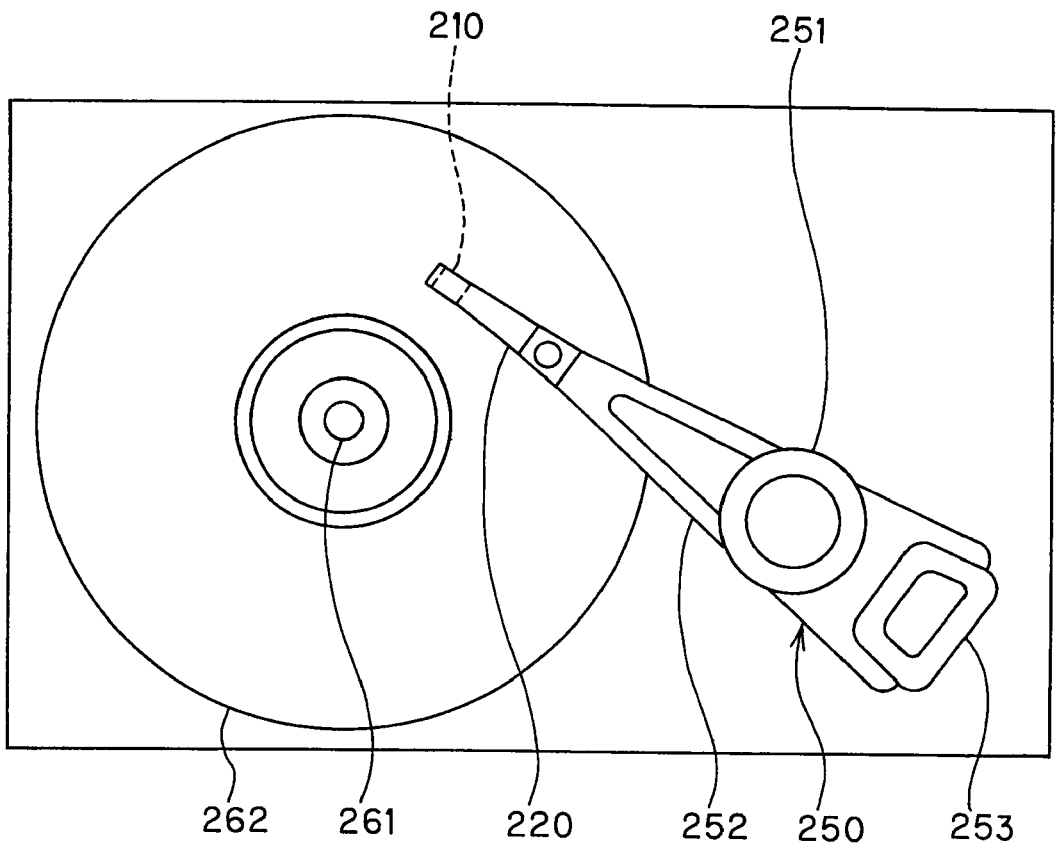
FIG. 10 is a plan view of the hard disk system according to one embodiment of the invention.

FIG. 9 is illustrative of part of the hard disk system, and FIG. 10 is a plan view of the hard disk system.

A head stack assembly 250 comprises a carriage 251 having a plurality of arms 252. The plurality of arms 252 are provided with a plurality of the head gimbal assemblies 220 such that they line up perpendicularly at an interval. On the side of the carriage 251 that faces away from the arms 252, there is a coil 253 attached, which coil becomes a part of the voice coil motor. The head stack assembly 250 is incorporated in the hard disk system.

The hard disk system comprises a plurality of hard disks 262 attached to a spindle motor 261. For each hard disk 262, two sliders 210 are located such that they are opposite to each other with the hard disk 262 held between them. The voice coil motor has also permanent magnets 263 located at opposite positions with the coil 253 of the head stack assembly 250 held between them.

The head stack assembly 250 except the slider 210 and the actuator correspond to the positioning device here which is operable to support the slider 210 and position it relative to the hard disk 262.

With the hard disk system here, the actuator is actuated to move the slider 210 in the track traverse direction of the hard disk 262, thereby positioning the slider 210 with respect to the hard disk 262. The thin-film magnetic head incorporated in the slider 210 works such that information is recorded by a recording head in the hard disk 262, and the information recorded in the hard disk 262 is played back by a reproducing head.

The head gimbal assembly and the hard disk system here have pretty much the same action as the thin-film magnetic head according to the foregoing embodiments.

While the embodiment here has been described with reference to the thin-film magnetic head of the structure wherein the reproducing head portion is located on the substrate side and the perpendicular recording head portion is stacked on the reproducing head, it is contemplated that that order of stacking could be reversed. When the thin-film magnetic head here is used as a read-only head, the recording head could be removed from it.

Specific Experiments

The magnetoresistive device of the invention is now explained in further details with reference to some specific experiments.

EXPERIMENTAL EXAMPLE 1

SAMPLE PREPARATION FOR EXAMPLE 1

An experimental sample (the sample of Example 1) for the magnetoresistive device of such construction as shown in FIG. 1 was prepared.

That is, the magnetoresistive device 8 of such multilayer construction as set out in Tables 1 and 2 was formed on the lower shield layer 3 made of NiFe (having an X-axis direction size of 30 μm, a Y-axis direction size of 30 μm and a Z-axis direction size of 1 μm). For an easy understanding of the multilayer structure, the multilayer structure for the sensor site is set out in Table 1, and the multilayer structure for that on the depth side from the sensor site is set out in Table 2.

An MgO insulating layer was formed on each side in the width direction of the triple-layer portion or the sensor site, viz., the multilayer structure of the sensor area 131 for the first ferromagnetic layer 130, the non-magnetic intermediate layer 140 and the sensor area 151 for the second ferromagnetic layer 150, after which such biasing layers 41 and 49 as shown in FIG. 4 were located and formed via those insulating films.

The ends of the biasing layers 41 and 49 near the sensor areas constituted the same magnetic pole (N-pole) as shown in FIG. 4, and bias magnetic fields were applied from both the biasing layers in the opposite directions along the width direction. The magnitude of the bias magnetic field applied was such that the initial state shown in FIG. 5A (with the orthogonal intersection of the magnetizations 131a and 151a) was created.

Further on the aforesaid device, the upper shield layer 5 made of NiFe (having an X-axis direction size of 30 μm, a Y-axis direction size of 18 μm and a Z-axis direction size of 1 μm) was formed with a nonmagnetic layer interposed between them.

In this way, the sample of Example 1 was prepared.

TABLE 1

| Multilayer Structure for the Sensor Site | | Layer Material | Thickness (nm) |
|---|---|---|---|
| Cap Layer (500) | | Ru(upper)/Ta(lower) | 3.0/2.0 |
| Sensor Area | Sensor Area for the second ferromagnetic layer (151) | CoFe | 3.0 |
| | Nonmagnetic Intermediate Layer (140) | Cu/ZnO/Cu | 3.0(Total) |
| | Sensor Area for the First Ferromagnetic Layer (131) | CoFe | 3.0 |
| Buffer Layer (300) | | Ta(upper)/Ru(lower) | 2.0/3.0 |

TABLE 2

| Multilayer Structure on the Depth Side from the Sensor site | | Layer Material | Thickness (nm) |
|---|---|---|---|
| Magnetization Direction Control Area for the Second Ferromagnetic Layer (155) | | CoFe | 3.0 |
| Control Multilayer Arrangement (120) | Second Exchange Coupling Transfer Layer (129) | Al$_2$O$_3$ | 0.5 |
| | Second Fixed Magnetization Layer (127) | NiFe | 2.0 |
| | Antiferromagnetic Layer (125) | IrMn/FeMn/IrMn | 5.0 (Total) |
| | First Fixed Magnetization Layer (123) | NiFe | 2.0 |
| | First Exchange Coupling Transfer Layer (121) | Ru | 1.7 |

TABLE 2-continued

| Multilayer Structure on the Depth Side from the Sensor site | Layer Material | Thickness (nm) |
|---|---|---|
| Magnetization Direction Control Area for the First Ferromagnetic Layer (135) | CoFe | 3.0 |

The thus formed sample of Example 1 was used to detect a signal magnetic field from a medium corresponding to −400 Oe to 400 Oe. As a result, it has been confirmed that viable magnetic resistance changes are obtainable. In this conjunction, the MR rate was found to be 20%.

From the aforesaid results, the advantages of the invention would be undisputed. That is, the invention provides a magnetoresistive device with the CPP (current perpendicular to plane) structure, comprising a nonmagnetic intermediate layer, and a first ferromagnetic layer and a second ferromagnetic layer stacked and formed with said nonmagnetic intermediate layer interposed between them, with a sense current applied in the stacking direction, wherein each of said first and second ferromagnetic layers comprises a sensor area joining to the nonmagnetic intermediate layer near a medium opposite plane and a magnetization direction control area that extends further rearward (toward the depth side) from the position of the rear end of said nonmagnetic intermediate layer; a magnetization direction control multilayer arrangement is interposed at an area where the magnetization direction control area for said first ferromagnetic layer is opposite to the magnetization direction control area for said second ferromagnetic layer in such a way that the magnetizations of the said first and second ferromagnetic layers are antiparallel with each other along the width direction axis; and said sensor area is provided at both width direction ends with biasing layers working such that the mutually antiparallel magnetizations of said first and second ferromagnetic layers intersect in substantially orthogonal directions. It is thus possible to obtain a magnetoresistive device that, while the magnetization directions of two magnetic layers (free layers) stay stabilized, can have high reliability, and can improve linear recording densities by the adoption of a structure capable of narrowing the read gap (the gap between the upper and lower shields) thereby meeting recent demands for ultra-high recording densities.

INDUSTRIAL APPLICABILITY

The present invention could be applied to the industry of magnetic disk systems comprising a magnetoresistive device operable to read the magnetic field intensity of magnetic recording media or the like as signals.

What we claim is:

1. A magnetoresistive device of a CPP (current perpendicular to plane) structure, comprising a nonmagnetic intermediate layer, and a first ferromagnetic layer and a second ferromagnetic layer stacked and formed with said nonmagnetic intermediate layer interposed between them, with a sense current applied in a stacking direction, characterized in that:

each of said first and second ferromagnetic layers comprises a sensor area joining to the nonmagnetic intermediate layer near a medium opposite plane and a magnetization direction control area that extends further rearward (toward a depth side) from a position of the rear end of said nonmagnetic intermediate layer, a magnetization direction control multilayer arrangement is interposed at an area where the magnetization direction control area for said first ferromagnetic layer is opposite to the magnetization direction control area for said second ferromagnetic layer in such a way that the magnetizations of the said first and second ferromagnetic layers are antiparallel with each other along a width direction axis, and said sensor area is provided at both width direction ends with biasing layers working such that the mutually antiparallel magnetizations of said first and second ferromagnetic layers intersect in substantially orthogonal directions.

2. The magnetoresistive device according to claim 1, wherein said magnetization direction control multilayer arrangement comprises, in order from said first ferromagnetic layer side, a first exchange coupling transfer layer, a first fixed magnetization layer, an antiferromagnetic layer, a second fixed magnetization layer, and a second exchange coupling transfer layer.

3. The magnetoresistive device according to claim 2, wherein in said magnetization direction control multilayer arrangement, said first and second fixed magnetization layers have magnetizations fixed by said antiferromagnetic layer in the same direction, and the magnetizations of said first and second ferromagnetic layers are antiparallel with each other along a width direction axis depending on what material is selected for each of said first and second exchange coupling transfer layers and what film thickness said material has.

4. The magnetoresistive device according to claim 3, wherein said first exchange coupling transfer layer is set up such that there is an antiferromagnetic coupling between said first ferromagnetic layer and said first fixed magnetization layer, and said second exchange coupling transfer layer is set up such that there is a ferromagnetic coupling between said second ferromagnetic layer and said second fixed magnetization layer.

5. The magnetoresistive device according to claim 3, wherein said first exchange coupling transfer layer is set up such that there is a ferromagnetic coupling between said first ferromagnetic layer and said first fixed magnetization layer, and said second exchange coupling transfer layer is set up such that there is an antiferromagnetic coupling between said second ferromagnetic layer and said second fixed magnetization layer.

6. The magnetoresistive device according to claim 1, wherein the ends, near said sensor area, of the biasing layers formed at both width direction ends of said sensor area form the same magnetic pole, and the directions of application of bias magnetic fields from both the biasing layers are opposite to each other along the width direction.

7. The magnetoresistive device according to claim 1, wherein each of said first and second ferromagnetic layers has a single domain structure.

8. The magnetoresistive device according to claim 1, wherein each of said first and second ferromagnetic layers has a width of 20 to 100 nm, and a depth direction length of 50 to 150 nm.

9. The magnetoresistive device according to claim 1, wherein the substantially orthogonal intersection of magnetizations of said first and second ferromagnetic layers is in the range of 90°±15°.

10. A thin-film magnetic head, characterized by comprising:
   a plane in opposition to a recording medium, and
   a magneto-resistive effect as recited in claim 1, which is located near said medium opposite plane to detect a signal magnetic field from said recording medium.

11. A head gimbal assembly, characterized by comprising:
   a slider including a thin-film magnetic head as recited in claim 10 and located in such a way as to oppose to a recording medium, and
   a suspension adapted to resiliently support said slider.

12. A magnetic disk system, characterized by comprising:
   a slider including a thin-film magnetic head as recited in claim 10 and located in such a way as to oppose to a recording medium, and
   a positioning device adapted to support and position said slider with respect to said recording medium.

* * * * *